United States Patent
Xu et al.

[11] Patent Number: 6,033,541
[45] Date of Patent: Mar. 7, 2000

[54] DEPOSITION PROCESS FOR COATING OR FILLING RE-ENTRY SHAPED CONTACT HOLES

[75] Inventors: Zheng Xu, Foster City; Hoa Kieu, Sunnyvale, both of Calif.

[73] Assignee: Applied Materials, Inc., Santa Clara, Calif.

[21] Appl. No.: 09/014,664

[22] Filed: Jan. 28, 1998

Related U.S. Application Data

[62] Division of application No. 08/867,276, Jun. 2, 1997, Pat. No. 5,780,357, which is a continuation of application No. 08/356,928, Dec. 14, 1994, abandoned.

[51] Int. Cl.$^7$ .................................................. C23C 14/34
[52] U.S. Cl. ............................... 204/298.03; 204/298.09; 204/298.11; 204/298.06; 204/192.13
[58] Field of Search .......................... 204/192.12, 192.3, 204/298.03, 298.06, 298.08, 298.09, 298.11, 192.13

[56] References Cited

U.S. PATENT DOCUMENTS

| | | | |
|---|---|---|---|
| 4,816,126 | 3/1989 | Kamoshida et al. | 204/192.3 |
| 4,874,493 | 10/1989 | Pan | 204/192.11 |
| 4,963,239 | 10/1990 | Shimamura et al. | 204/192.12 |
| 4,994,162 | 2/1991 | Armstrong et al. | 204/192.15 |
| 4,999,096 | 3/1991 | Nihei et al. | 204/192.3 |
| 5,108,570 | 4/1992 | Wang | 204/192.3 |
| 5,174,412 | 12/1992 | Talieh et al. | 204/192.17 |
| 5,431,799 | 7/1995 | Mosely et al. | 204/298.06 |
| 5,639,357 | 6/1997 | Xu | 204/192.3 |

FOREIGN PATENT DOCUMENTS

| | | |
|---|---|---|
| 0 297 502 | 1/1989 | European Pat. Off. . |
| 63-076321 | 4/1988 | Japan . |
| 63-216972 | 1/1989 | Japan . |
| 6-302543 | 10/1994 | Japan . |

OTHER PUBLICATIONS

Onuki et al., "Study on Step Coverage and (111) Preferred Orientation of Aluminum Film Deposited by a New Switching Bias Sputtering Method", Applied Phys. Letters, vol. 53, No. 11, 968–970 (Sep. 12, 1998).

Homma, "Planarization Mechanism of RF–Biased Al Sputtering", Journal of the Electrochemical Society, vol. 140, No. 3, 855–860 (Mar. 1, 1993).

"Planarizing Enhancement Mode 'Sputtering . . . Plus' for Planarized Aluminum in Sypherlin", MTI Applications Note, vol. 1, No. 1, 1986.

S. Wolf, "Silicon Processing for the VLSI Era", vol. 1, Lattice Press, 1986, pp. 343–346.

*Primary Examiner*—Rodney G. McDonald
*Attorney, Agent, or Firm*—Fish & Richardson

[57] ABSTRACT

A method and apparatus for depositing material to conformally cover or fill holes within the surface of a semiconductor substrate. The preferred method includes the steps of coherently depositing a first thickness of the material onto the surface of the substrate; reverse sputtering the deposited material so as to coat the sidewalls of the contact holes with the deposited material; after the first thickness of the material is deposited onto the surface of the substrate, depositing a second thickness of the material onto the surface of the substrate; and while depositing the second thickness of the material onto the surface of the substrate, heating the substrate to enhance reflow of the material being deposited.

5 Claims, 4 Drawing Sheets

PHASE I Deposition: — 100
  circulate coolant through platform to cool substrate during deposition coherently deposit material onto surface of substrate — 102 concurrently with coherent deposition, reverse sputter the deposited material on the substrate — 104 continue coherent deposition + reverse sputtering until a first predetermined thickness of material is deposited — 106

PHASE II Deposition: — 108
  deposit material onto previously deposited layer of material while depositing material, bombard surface of substrate with electrons to heat the deposited layer — 110 while depositing material, heat platform to cause reflow of deposited material — 112 continue above deposition + electron bombardment + heating until a second predetermined thickness of material is deposited — 114

FIG. 4

DEPOSITION PROCESS FOR COATING OR FILLING RE-ENTRY SHAPED CONTACT HOLES

This is a divisional of U.S. application Ser. No. 08/867,276, filed Jun. 2, 1997, now U.S. Pat. No. 5,780,357, which is a continuation of Ser. No. 08/356,928, filed Dec. 14, 1994, now abandoned.

BACKGROUND OF THE INVENTION

The invention relates to methods and apparatus for sputter deposition of material into high aspect ratio, reentry shaped contact holes in semiconductor substrates. More specifically, the invention relates to conformally covering the walls of such holes with the deposited material, or filling the holes with the material.

Semiconductor devices are typically multilayered structures fabricated on semiconductor wafers one layer at a time. At least one of the layers of the multilayered structure is a metalization layer which is patterned to produce conductive pathways or wires that electrically interconnect the devices that have been formed on the wafer. The metalization is usually deposited onto a passivation layer (e.g., $SiO_2$) that previously was deposited over the surface of the wafer to protect and isolate the underlying devices. To enable the metalization layer to make electrical contact to the semiconductor devices under the passivation layer, contact holes or vias are etched through the passivation layer prior to depositing the metal later. When the metal (e.g., Al) is deposited onto the wafer, it fills the contact holes and makes contact with the underlying devices.

It is generally desirable for contact holes to have vertical sidewalls. This is particularly true for the high aspect ratio contact holes (i.e., high length-to-width ratio), which now are commonly used to fabricate semiconductor devices with dimensions in the submicron range. However, vertical sidewalls are not always possible because the plasma etch processes that commonly are used to form the contact holes are difficult to control. If the plasma etch process is not stable, as often can be the case, the layer being etched can be "undercut" so as to produce "re-entry shaped" holes (see FIG. 1). In a "reentry shaped" hole 2, the walls 4 are not vertical as would be ideal; rather, the hole progressively increases in width from the top (i.e., the opening) to the bottom of the hole.

A reentry shaped hole is considerably more difficult to coat or fill with metal 6 than is a contact hole with ideally vertical sidewalls. If a conventional Al sputter deposition is used to coat or fill the hole, the deposited material will tend to build up near the upper edge of the contact holes to form an overhang 8. The overhang will prevent sputtered material from going into and reaching the bottom of the contact hole. For very small, high aspect ratio holes this problem is particularly severe.

One can use a coherent sputter deposition to prevent the formation of the overhang. By coherent deposition, we mean that the sputtered material that reaches the wafer is confined by some mechanism to a narrow angular distribution (e.g., the trajectories of the sputtered material reaching the wafer are tightly distributed about a direction that is normal to the surface of the wafer). A coherent deposition insures that more sputtered material will reach, and deposit on, the bottom of the re-entry shaped contact holes. However, if the angle of the re-entrant shaped side walls is too great, even coherent sputtering often cannot completely cover the walls of the holes or completely fill the holes.

In other words, the commonly used sputter deposition and reflow processes are not well suited for reentry shaped contact holes. Specifically, the presence of re-entry shaped contact holes tends to result in poor to nonexistent electrical contacts to the devices at the bottom of the contact hole. Consequently, a wafer conventionally must be scrapped if the process for etching contact holes inadvertantly produces overly reentrant shaped holes. Thus, a need exists for a deposition process for coating the walls of, or filling, reentrant shaped holes, so that wafers having such holes would not have to be scrapped.

SUMMARY OF THE INVENTION

The invention is a method and apparatus for depositing a layer of material on a semiconductor substrate whose surface includes holes. The invention facilitates conformally covering the walls of the holes, or else completely filling the holes without voids, even if some of the holes are reentrant shaped, that is, have apertures smaller than their bases.

A first aspect of the invention is a method for conformauly covering the walls of the holes with a layer of material. The method includes the steps of: (a) depositing the material onto the bottoms of the holes to a first thickness less than that required to fill the holes; and (b) reverse sputtering the deposited material so as to completely coat the side walls of the holes with the deposited material.

Preferably, the reverse sputtering step (b) is performed concurrently with the deposition step (a) by applying a negative bias voltage to the substrate during the deposition.

The deposition step (a) preferably includes depositing the material "coherently", that is, directing the material toward the substrate in trajectories sufficiently perpendicular to the substrate that a substantial portion of the material which enters the opening of each hole deposits on the base of the hole. The coherent deposition preferably is performed by sputtering the material (or a precursor of the material) from a sputtering target, while obtaining coherent sputtering trajectories either by positioning the substrate a sufficient distance from the sputtering target, or by interposing a collimator between the substrate and the target.

A second aspect of the invention is a method for completely filling the holes without voids. This method includes: (a) a first step of conformally covering the walls of the holes in accordance with the first aspect of the invention as defined above, and then (b) depositing onto the substrate surface a second thickness of material sufficient to fill the holes, while (c) simultaneously heating the substrate surface sufficiently to enhance reflow of the material being deposited. The initial conformal coating functions as a "wetting" or "nucleation" layer during the hole-filling deposition step. Consequently, material deposited on the upper portions of the walls of a hole during the hole-filling deposition step will flow over the wetting layer so as to completely fill the hole without voids. This contrasts with conventional deposition processes in which material deposited on the upper portions of the walls of a hole can create an overhang that occludes the hole, thereby leaving an unfilled void within the hole.

The step of heating preferably includes both bombarding the surface of the substrate with electrons to enhance reflow of the deposited material and heating the substrate from a heat source such as a resistively heated pedestal or radiant heat lamps. The bombarding electrons should have energy levels large enough to heat the deposited material, but not so large as to damage electrical devices fabricated in the underlying substrate.

Because the hole-filling process of the invention causes reflow of the material deposited on the outer surface of the substrate as well as the material deposited in the holes, the process advantageously planarizes the material deposited on the surface of the substrate while the holes are being filled. In contrast, conventional processes for filling holes often produce a layer on the outer surface of the substrate having undulations conformally following the hole pattern, and these undulations must be removed by an additional planarizing step. An advantage of the present invention is that it can eliminate the need for this additional planarizing step:

The invention now makes it possible to fill high aspect ratio holes even if the holes have a reentry shape, that is, an aperture smaller than the base. Previously, when an etch process used to produce a hole inadvertantly produced reentry shaped holes, the entire wafer had to be scrapped because the existing deposition and planarization techniques were not able to reliably fill the contact holes without forming voids within the holes. Consequently, it was very important to tightly control the etch process so as to prevent the formation of re-entry shaped holes. The new metalization and planarization process in accordance with the invention is much more tolerant of variations in the preceding etch process.

Other advantages and features will become apparent from the following description of the preferred embodiments and from the claims.

BRIEF DESCRIPTION OF THE DRAWINGS

FIG. 4 is a flow chart of a complete metalization process including hole-filling and planarizing.

DETAILED DESCRIPTION OF THE PREFERRED EMBODIMENTS 1.0 System Hardware

A hole-filling and film planarizing process in accordance with the invention involves two deposition phases referred to as Phase I and Phase II. Phase I conformally coats or covers the side walls of the holes on the surface of a semiconductor wafer or substrate, and then Phase II fills the holes. If it is desired to conformally cover the walls of the holes without filling the holes, Phase I can be performed without Phase II.

During Phase I, a predetermined amount of material (e.g., Al) is coherently sputter deposited onto an unheated semiconductor substrate or wafer. Either concurrently or subsequently, the surface of the substrate is bombarded with inert gas ions.

During Phase II, the substrate is heated and additional material is deposited onto the substrate, preferably while the deposited material is simultaneously bombarded by electrons. In contrast with Phase I, the Phase II deposition process need not be coherent.

Figure 2:
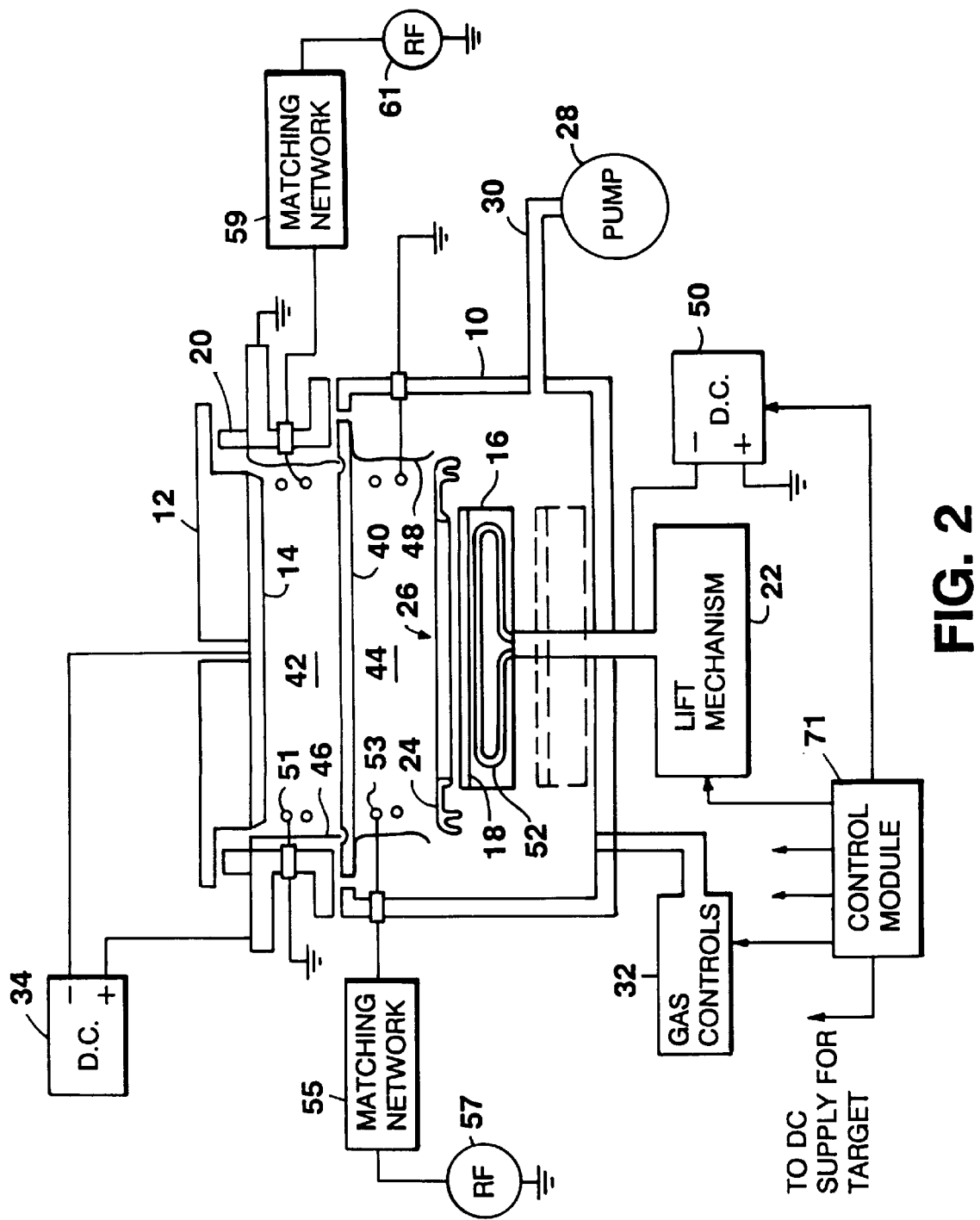
FIG. 2 is a diagram of a sputtering deposition chamber in which the conformal deposition process can be carried out.
Figure 3:
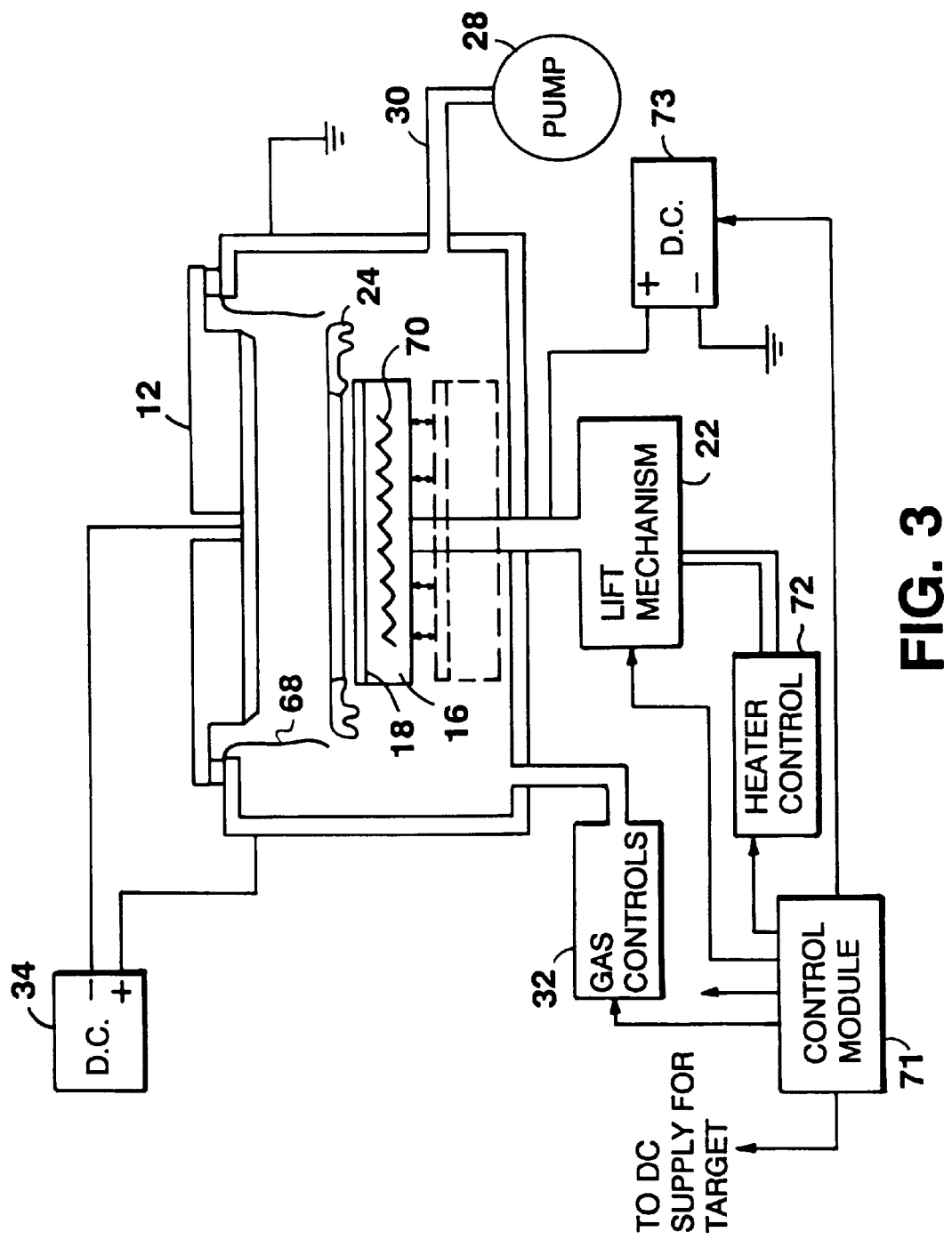
FIG. 3 is a diagram of a sputtering deposition chamber in which the hole-filling and planarizing process may be carried out.

Phases I and II can be performed in a single chamber. However, in the preferred embodiment described below, Phase I and Phase II are carried out in separate chambers. The Phase I process preferably is carried out in a coherent deposition chamber which includes a mechanical collimator, as illustrated in FIG. 2. The Phase II deposition is carried out in a conventional deposition chamber without a collimator, as illustrated in FIG. 3. Before describing the details of each Phase, the two deposition systems will be described with reference to features that are relevant to practicing the invention.

Referring to FIG. 2, a sputter deposition system in which the Phase I of the planarization process is carried out includes a deposition chamber 10, a source assembly 12 on which a sputter target 14 is mounted, and a movable lower pedestal or platform 16 for holding a substrate 18 on which material sputtered from target 14 is deposited. In the described embodiment, the source assembly is a magnetron, although any conventional sputtering source can be used. The source assembly and the target mounted thereon are electrically isolated from the rest of the chamber by an insulator ring 20. The lower platform can be raised and lowered by a mechanical lift mechanism 22. The lift mechanism raises the substrate up until it contacts a clamping ring 24. The clamping ring, which has a central aperture 26 that is slightly smaller in diameter than the substrate, holds the substrate onto the platform and shields the platform from the plasma and deposition material during processing.

A collimation filter 40, preferably positioned midway between the target and the substrate, separates chamber 10 into an upper cavity 42 and a lower cavity 44. Sputtered material leaving the target typically has a broad range of trajectories that are distributed around a direction that is normal to the target The collimation filter blocks (i.e., filters out) all sputtered material having a trajectory that diverges from the normal direction by more than a preselected angle. The collimation filter is a metal plate, preferably made of a refractory material such as titanium. It has an array of holes passing through it which have a specified aspect ratio, which is defined as the ratio of their length to their diameter. To maximize throughput, the holes are hexagonal in shape and form honeycomb structure. The maximum angle from the normal through which particles can travel through the collimator without being blocked approximately equals the angle whose cotangent is the aspect ratio of the holes. For example, long, narrow holes filter out more of the sputtered material and produce a narrower angular distribution than do short, wide holes. In the described embodiment, the plate has a thickness of about 0.950 inch and the holes are about 0.625 inch in diameter.

The collimation filter preferably is connected to ground and thus forms a ground plane separating the two cavities. Within the upper cavity and around its inside perimeter there is a cylindrical shield 46 that prevents material from being deposited on the walls of the chamber. Likewise, the lower cavity also includes another cylindrical shield 48 which serves a similar purpose. Both shields are connected to ground potential.

A vacuum pump 28, connected to the chamber through a vacuum line 30, is used to evacuate the chamber to establish the appropriate vacuum at the beginning of a process run. Gas control circuitry 32 controls the flow of inert sputtering gas (e.g. Ar) into the chamber during processing. A DC voltage supply 34 supplies power to the target to initiate and sustain a plasma deposition process. The negative terminal of the DC supply is connected to the target and the positive terminal of the DC supply is connected to the electrically grounded wall of the chamber. A second DC power supply 50 biases the platform, including the substrate, negatively relative to the collimation filter and the chamber wall.

Platform 16 includes a network of coolant passageways 52 through which an external pump (not shown) circulates a coolant (e.g. water at 23° C.) to cool the platform during processing.

The deposition chamber just described is entirely conventional, except for the inclusion of the second DC power supply 50 to negatively bias the substrate. As will be described below, the negative substrate bias causes reverse sputtering of the material (e.g., TiN) being deposited on the substrate.

A deposition chamber adapted for carrying out the Phase I deposition is shown in FIG. 3. This chamber has most of the same elements as the chamber shown in FIG. 2 (indicated by like numbered elements in the figures). One principal difference is the absence of a collimation filter. As will be explained below, the Phase II deposition is conducted under conditions which promote reflow of the deposited material. Specifically, reflow occurs during Phase II because the holes already have been coated with the nucleation layer deposited during Phase I and the substrate surface is heated sufficiently to induce reflow. The reflow of material while it is deposited during Phase II prevents a hole from being occluded by material deposited on the upper portions of the hole walls, even if the material is incoherent or uncollimated.

Since a collimator is not necessary during Phase II, it is advantageously omitted, because a collimator would unnecessarily waste expensive target material by blocking some sputtered material from reaching the substrate. Without a collimator, a given deposition rate can be achieved at a reduced target sputtering rate compared with a chamber having a collimator, thereby extending the life of the target. Of course, since the Phase II depostion chamber has no collimation filter, it needs only one cylindrical shield 68 extending from near the target toward the platform.

Another principal difference between the deposition chambers used for Phases I and II is that the platform 16 in the Phase II chamber includes a resistive heater 70 which is operated by a heater control circuit 72 to heat the platform to a user setable temperature (e.g. 520° C. for Al deposition). A DC supply 73 is connected to platform 16 so as to bias the substrate, as was possible in the chamber shown in FIG. 2. However, in this case the DC supply is connected so as to bias the substrate to a positive voltage relative to the chamber wall rather than to a negative voltage as was the case for the coherent deposition chamber.

The DC supplies, the gas controls, the lift mechanism and the other electronic components in the system are controlled in conventional fashion by a control module 71 shown in FIGS. 2 and 3. The control module is programmed to automatically carry out the sequence of operations described herein thus minimizing the need for operator involvement.

2.0 Planarization Process

The steps of the Phase I and Phase II depositions are shown in FIG. 4 and described below.

2.1 Phase I

Figure 1:
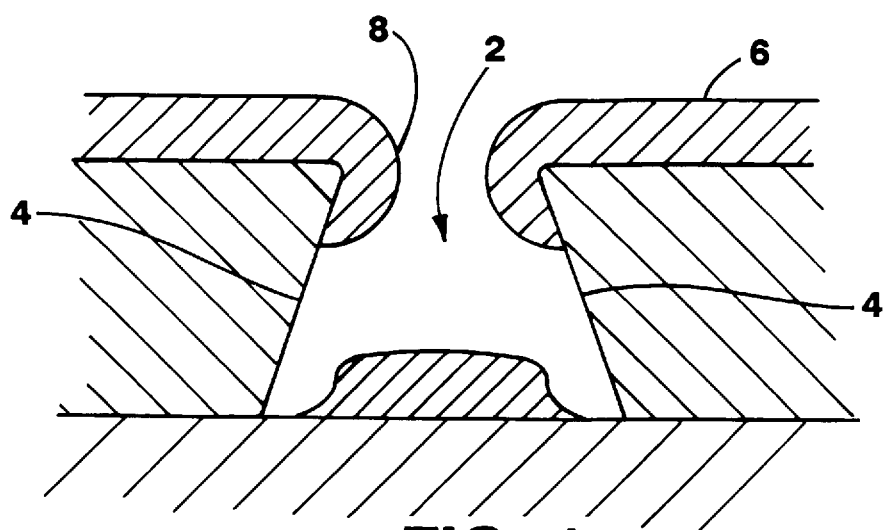
FIG. 1 shows a conventional reentry shaped contact hole.

In the preferred embodiment, the Phase I conformal deposition of aluminum is carried out in the chamber shown in FIG. 1 using an argon atmosphere. To perform the Phase I deposition and resputtering processes simultaneously, both the target 14 and the wafer support platform 16 (and hence, the semiconductor wafer 18) are biased to negative voltages so that both the target and the substrate are bombarded by ions from the plasma. The collimator 40 is electrically grounded. In addition, sufficient electrical power is coupled to the argon gas produce a plasma The source of power may be the bias voltage on the target, or it may be a separate, conventional plasma excitation source. Ar$^+$ ions from the upper cavity plasma generates bombard the negatively biased Al target with sufficient energy to sputter Al atoms off of the target and towards the substrate (step 102).

As stated in the Summary of the Invention, the Phase I deposition and resputtering processes can be performed sequentially rather than simultaneously, although this alternative presently is considered less preferable. In this alternative, the target would be negatively biased only during the deposition process, and the substrate would be negatively biased only during the subsquent resputtering process.

In the resputtering process, whether performed simultaneously or after the deposition, the bias applied to the wafer support pedestal or platform 16 produces a second plasma in the lower cavity. This plasma, like the plasma produced in the upper cavity, generates Ar$^+$ ions. But because of the negative bias on the platform 16, the Ar$^+$ ions generated in the lower cavity accelerate towards and bombard the surface of the substrate while the Al sputtered off the target is also being deposited there (step 104). The bombarding Ar$^+$ ions serve to resputter the deposited material at the bottom of the contact holes onto the side walls of the reentry shaped holes, thereby forming a nucleation layer or wetting layer on those side wall surfaces.

Increasing the negative bias voltage on the platform proportionately increases the energy of the bombarding Ar$^+$ ions, which increases the rate at which the ions sputter material off of the bottom of the contact holes. The bias voltage should be sufficient to resputter some of the Al material being deposited on the bottom of the contact hole (i.e., above about 20–30 eV), but not so high as to remove all of the material that is being deposited on the bottom of the contact hole, and not so high that the bombarding Ar$^+$ ions damage any electrical devices in the underlying substrate. We have successfully tested the invention using DC power supply 73 to apply a bias of −450 volts to the wafer support platform 16. For depositing material other than aluminum, the appropriate bias voltage should be adjusted in proportion to the sputtering yield of the material. The sputtering yield of various materials as a function of the energy of bombarding ions (and hence the platform bias voltage) is extensively published, so the bias voltage readily can be adjusted for depositing materials other than aluminum.

Preferably, the substrate is not heated during the resputtering process, so as to maintain the substrate at a relatively cool temperature. Specifically, the substrate temperature should be maintained low enough to avoid two undesirable results. First, the temperature should be low enough to prevent material resputtered from the base of the hole from resputtering any substantial amount of material already deposited on the side walls rather than depositing there. Second, the temperature should be low enough to prevent the material deposited on the side walls from "de-wetting", i.e., leaving some of the side wall surface uncovered by the deposited material. Preferably, this is accomplished by maintaining the substrate at a temperature no greater than about 150° C. In the preferred embodiment, the platform 16 is water cooled during Phase I to maintain the substrate temperature less than about 50° C. (step 100).

Instead of using a mechanical collimator during the Phase I deposition process, similar results can be achieved by increasing the distance between the target and the substrate (the "sputtering distance"), thereby increasing the coherency (i.e., reducing the maximum trajectory angle) of the sputtered material. Whether the coherency of the sputtered material is achieved by a collimator or by a long sputtering distance, the coherency must be sufficient to deposit a substantial amount of material on the base of each hole. The material deposited on the base of each hole is resputtered (by the resputtering process) onto the side walls of the hole to achieve complete, conformal coverage of the hole walls by the material. If the sputtered material is overly incoherent (i.e., an excessive portion of the material has oblique trajectories relative to the substrate surface), the amount of material deposited on the base of each hole will be insufficient to completely cover the side walls when it is resputtered. If a perforated plate collimator 40 is used to achieve coherency, as in the preferred embodiment shown in FIG. 2, the coherency is increased by increasing the ratio of the length to the width of the perforations. If coherency is achieved by a long sputtering distance, increasing the distance increases the coherency.

In the tested embodiment, the final desired metalization thickness was about 10,000 Å, and the Phase I deposition was continued until about 4000 Å was deposited on the top surface of the substrate (step 106). This resulted in sufficient material deposited on the base of each hole to completely cover the sidewalls when resputtered. Of course, the thickness of material remaining on the base of each hole after resputtering will be less than the thickness on the top surface of the substrate because some of the material originally deposited on the base of a hole will have been resputtered onto the sidewalls of that hole. In our tests using 0.35 micron wide holes with an aspect ratio of about 3:1, the thickness of aluminum deposited on the bottom of the hole was about 40% of the amount that is deposited on the top surface of the substrate, namely, about 1600 Å.

2.2 Phase II

To perform the Phase II deposition, the substrate is transferred to the second sputter deposition chamber, shown in FIG. 2, of any conventional design which preferably does not include a collimator. To protect the deposited layer on the substrate from oxidation and contamination, the substrate preferably is maintained in a clean vacuum enclosure while being transferred from the first chamber to the second chamber.

A second Al sputter deposition is performed in the second chamber (step 108) to finish filling the holes. As in any conventional sputtering process, the target is biased to a negative voltage, so that argon ions from the plasma bombard the target and sputter material from the target onto the substrate.

During Phase II, the platform is heated to a temperature which is high enough to reflow the deposited metal (step 112). The Phase II deposition is continued until the deposited layer has the desired thickness (step 114).

Preferably, during Phase II the reflow of the deposited metal is enhanced by applying a positive bias voltage to the platform 16. The positive bias on the substrate causes free electrons generated in that plasma to accelerate towards and bombard the surface of the substrate while Al is simultaneously being sputter deposited onto the substrate (step 110). The positive bias on the substrate is set sufficiently high to cause the bombarding electrons to heat the deposited Al material, thereby enhancing reflow of the material.

In the preferred embodiment, the deposited aluminum layer is heated to about 600° C. to enhance reflow. Because electrons are bombarding the substrate and thereby heating the deposited Al material, the deposited Al layer will be at a higher temperature than the substrate. Consequently, the substrate temperature need not be as high as would be required to achieve reflow in the absence of the electron bombardment In the preferred embodiment, the substrate is heated to only 450° C. to produce an Al layer temperature of about 600° C. Thus, an advantage of bombarding the substrate with electrons during deposition is that it reduces the substrate temperature required to reflow the deposited material as compared to conventional reflow processes,. (Because of imperfect heat conductivity between the substrate and the platform in the tested embodiment, the platform is heated to 520° C. to raise the substrate temperature to this 450° C. level.) The energy of the bombarding electrons must be sufficient to heat the layer of deposited material, but not so high as to penetrate through the deposited metal and into the underlying devices where they may cause damage. In general, it is desirable to maximize electron density by applying high power to the plasma to maximize the plasma density, and it is desirable to minimize electron energy by applying a low bias voltage to the platform.

Because the sidewalls of the contact holes have been "wetted" (i.e., coated by a "nucleation layer" of the material being deposited) by the reverse sputtering which took place during Phase I, during the Phase II deposition the reflowed metal will more readily flow into and fill the contact holes. In contrast, in prior art process in which the sidewalls are not wetted, the deposited material can more readily form a bridge over the opening of the contact hole and leave an unfilled hole beneath the bridge.

In the described embodiment, during the Phase II deposition the target voltage is kept at the same −500 volt level used in Phase I, but the target power is reduced to about 2,000 watts, and the bias applied to the platform is set to about +100 to +200 volts. The resulting deposition rate is reduced as compared to the Phase I deposition. This reduced deposition rate provides sufficient time for the deposited material to redistribute itself and fill the contact holes during the deposition. If the target power is set too high, the deposition rate may be so high that the deposited material may not be able to flow (i.e., redistribute) quickly enough to prevent the small contact holes from bridging over.

As indicated above, it is preferable that the substrate be transferred from the first chamber to the second chamber under vacuum conditions. This is to avoid contamination of any kind from adhering to the surface of the recently deposited layer during the transition from Phase I to Phase II. If gas molecules, such as $O_2$ or $N_2$, are permitted to attach to the new surface, they can negatively impact the adhesion and reflow of deposited material during the subsequent Phase II deposition.

Figure 5:
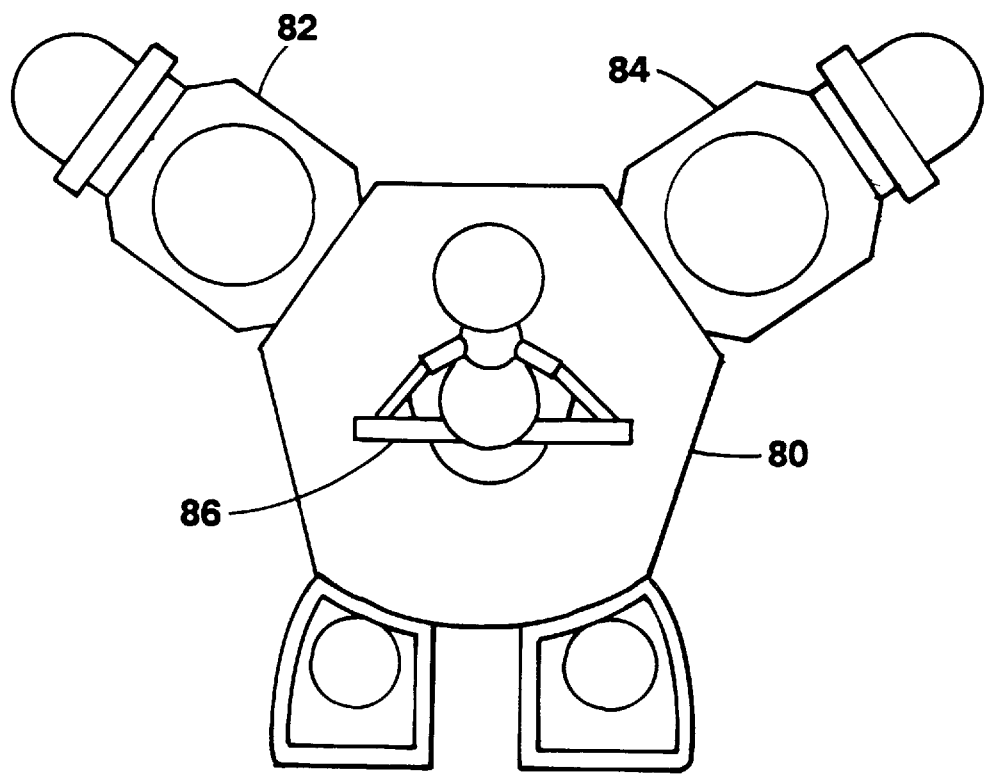
FIG. 5 is a diagram of a conventional cluster tool.

An transfer under vacuum can easy be done in conventionally designed, commercially available deposition systems, such as the Centura 5200 PVD cluster tool that is sold by Applied Materials, Inc. of Santa Clara, Calif. FIG. 5 is a diagrammatic representation of a representative cluster tool. It typically includes a central transfer chamber 80 onto which can be bolted one or more process chambers, e.g. a deposition chamber 82 (i.e., the Phase I chamber) and a reflow camber 84 (i.e., the Phase II chamber). The process chambers and the transfer chamber are isolated from each other by slit valve openings, which can be opened to allow the transfer of substrates into and out of the chamber and closed to isolate the connected chambers from each other. Thus, each chamber may be maintained at its own vacuum pressure and atmosphere independent of the other chambers. In addition, the transfer chamber includes a robot mechanism 86 for transferring substrates into and out of the different process chambers and from one chamber to the next chamber. Separate vacuum pumps and gas supply systems (not shown) are used to produce the desired vacuums and process atmospheres in each chamber.

Both phases can, of course, be performed in the same chamber rather than two different chambers. In that case, the deposition chamber would have the combined features of the chambers shown in FIGS. 2 and 3. For example, the platform would have cooling channels in it for circulating coolant to maintain the substrate at a cool temperature during the Phase I deposition, and it would also have a resistive heater for heating the substrate during the Phase II deposition. Further, it would be preferable that the power supply which is connected to the platform be switchable so that the polarity of the bias to the platform may be easily reversed when transitioning from a Phase I deposition to a Phase II deposition.

In addition, the presence of a collimation filter during Phase II that blocks the flow of electrons from the upper cavity plasma to the platform, would require the formation of a second plasma in the lower cavity to provide a source of bombarding electrons. The second plasma can be generated by applying a larger bias voltage to the platform or by providing a separate source of electrical power to excite a plasma above the substrate. Alternatively, the collimator could be moved out of the path between the target and the substrate during Phase II.

As stated in the description of Phase I, instead of using a mechanical collimator during Phase I, similar results can be achieved by increasing the distance between the target and the substrate (the "sputtering distance"), thereby increasing the coherency (i.e., reducing the maximum trajectory angle) of the sputtered material. If a mechanical collimator is not used, both Phase I and Phase II readily can be performed within a single deposition chamber. In this case, the distance between the target and the substrate preferably should be reduced during Phase II, because greater distances generally result in more sputtered material being wasted by deposition on the chamber walls.

3.0 Experimental Results

The benefits of a Phase I deposition followed by a Phase II deposition are illustrated by the following experimental example of two aluminum metalizations which we performed. A two phase process was performed on two wafers, each of which had an oxide layer containing an array of reentry shaped contact holes with an aspect ratio of about 3:1 and a top opening of about 0.3 microns. Both processes were identical except that the appropriate biases for conducting Phase I and Phase II type depositions were applied to the platform for one wafer but not for the other.

Both wafers were prepared for the aluminum metalization by first performing a 200 Å preclean etch to produce a clean surface on the oxide and improve the contact resistance of the contacts that are to be deposited. Then, using a coherent deposition process, a 200 Å layer of Ti was deposited, followed by a 700 Å layer of TiN. The Ti deposition establishes a nucleation or wetting layer for the subsequent TiN deposition. The TiN layer establishes a barrier for preventing Al from diffusing into the silicon when the substrate is later heated during the reflow'process. After the barrier layer was deposited, the wafer was heated in a separate metal anneal chamber to 650° C. in an atmosphere of $O_2$ and $N_2$. Then a 500 Å layer of Ti was coherently deposited onto the wafer to provide a "glue" layer to which the aluminum can attach. With this last deposition, the wafers were ready for the metalization.

For both wafers, the aluminum was deposited onto the wafer in two steps. During the first step, a 4000 Å layer of Al/0.5% Cu was coherently deposited onto cold wafers (i.e., 50° C.). During the second step, using another deposition chamber from that used for the first step, a 6000 Å layer of Al/0.5% Cu was deposited (non-coherently) onto heated wafers (i.e., 520° C.). The process conditions were identical during the first step except that a 450 volt DC negative bias was applied to the platform holding the second wafer and was not applied to the platform holding the first wafer.

During the second step, again the process conditions were identical except that a 230 volt positive bias (current limited to 13 amps) was applied to the platform holding the second wafer but not to the platform holding the first wafer.

The results were examined by cross-sectioning the processed wafers and then viewing them under a scanning electron microscope at a magnification of about 40,000. In the case of the first wafer (i.e., the wafer processed using conventional techniques), the deposited metal bridged over the tops of the reentry shaped contact holes and no metal flowed into the holes. In contrast, in the case of the second wafer which was processed in accordance with the invention, the deposited metal had flowed into the reentry shaped contact holes, completely filling them up.

It should be noted that the above-described technique can also be used to improve the sidewall coverage for any deposited material. For example, one can use the technique to obtain sidewall coverage of the above-mentioned Ti glue layer that is deposited before the Al metalization.

4.0 Alternative Embodiment

As stated above, increasing the plasma density permits increasing the sputtering rate and/or decreasing the substrate bias voltage to reduce the risk of damage to the electrical devices on the substrate. A capacitively coupled plasma source such as the magnetron source used in the described preferred embodiment generally cannot achieve as high a plasma density as an inductively coupled plasma source. A suitable design using an antenna to couple migher amounts of RF power to the plasma so as to increase the plasma density is described in U.S. patent application, Ser. No. 08/145,744, entitled "Collimation Hardware with RF Bias Rings to Enhance Sputter and/or Substrate Cavity Ion Generation Efficiency", incorporated herein by reference. This design can increase plasma density in the lower cavity, increase the sputtering efficiency in the upper cavity and/or control the reverse sputtering rate in Phase I Referring to FIG. 2, the modifications involve using a ring antenna 51 located inside the upper and/or a ring antenna 53 inside the lower cavity. The ring antennae are used to pump additional power into the plasma thereby increasing the efficiency of the process. For example, the upper antenna serves to increase sputtering efficiency. Whereas, the lower antenna serves to increase electron plasma density and/or to gain greater control over the reverse sputtering process.

Both antennae 51 and 53 are coils with one or more turns. An RF generator 61 coupled to upper ring antenna 51 through an RF matching network 59 provides the RF power to the upper ring antenna. A second RF generator 57 coupled to lower ring antenna 53 through an RF matching network 55 provides the RF power to the lower ring antenna. In both cases, an electrical connection is made to the antenna through a feed-through in the wall of the chamber and the other side of the antenna is electrically connected to ground through another feed-through in the chamber wall.

Note that delivering RF power through the lower antenna does not affect the sputter rate of the target, but it does increase the bombardment energy and ionization of the sputtered species onto the wafer. Thus, the lower antenna can also be used to optimize the bombardment energy to control the characteristics of the deposited material and the barrier characteristics.

Though the power generators are described as DC power sources, this is merely for purposes of illustration. The invention is not limited to only using those power sources but encompasses other power generators. For example, it may be desirable to use an RF power source for producing bias on the platform. One advantage of the RF power source is that it is less likely to produce the arcing that tends to be associated with DC sources. In addition, if a lower antenna is used to introduce power into the lower chamber cavity, then it may not be necessary to separately bias the platform. The plasma that is created by the lower antenna will produce a positive bias on the platform.

Other embodiments are within the scope of the following claims.

What is claimed is:

1. Apparatus for forming a planarized layer of material on a substrate which includes contact holes having sidewalls that are formed within a surface of the substrate, comprising:
   a deposition chamber;
   a sputter target made of a constituent of said material,
   a platform for holding the substrate;
   a first power supply connected to the sputter target;
   a second Power supply connected to the platform;
   a control module programmed to carry out the following steps:
      depositing a first thickness of the material onto the surface of the substrate to form deposited material;
      reverse sputtering the deposited material so as to coat the sidewalls of the contact holes with the deposited material;
      after the first thickness of said material is deposited onto the surface of the substrate, depositing a second thickness of said material onto the surface of the substrate; and
      while depositing the second thickness of said material onto the surface of the substrate, causing the second power supply to bias the substrate to a positive voltage relative to around so that the substrate is bombarded by electrons thereby heating the substrate to enhance reflow of the material being deposited.

2. The apparatus of claim 1 wherein the control module is programmed to carry out the steps of depositing the first material and reverse sputtering concurrently.

3. The apparatus of claim 1 further comprising a collimation filter between said target and said platform.

4. The apparatus of claim 1 further comprising a heater thermally coupled to the platform so as to heat the substrate during processing.

5. The apparatus of claim 4 wherein the control module is programmed to cause the heater to heat the substrate while the substrate is being bombarded by electrons.

* * * * *